US006982899B2

(12) United States Patent
Sumitani et al.

(10) Patent No.: US 6,982,899 B2
(45) Date of Patent: Jan. 3, 2006

(54) SEMICONDUCTOR MEMORY DEVICE

(75) Inventors: Norihiko Sumitani, Osaka (JP); Shigeo Houmura, Kyoto (JP); Youji Nakai, Osaka (JP); Hidenari Kanehara, Osaka (JP); Kazuki Tsujimura, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 28 days.

(21) Appl. No.: 10/752,663

(22) Filed: Jan. 8, 2004

(65) Prior Publication Data

US 2004/0141362 A1 Jul. 22, 2004

(30) Foreign Application Priority Data

Jan. 10, 2003 (JP) ............................. 2003-004036

(51) Int. Cl.
*G11C 11/00* (2006.01)
(52) U.S. Cl. ...................... 365/154; 365/156; 365/203; 365/202; 365/230.06
(58) Field of Classification Search ............... 365/154, 365/156, 203, 202, 230.06
See application file for complete search history.

(56) References Cited

U.S. PATENT DOCUMENTS

| 5,453,949 | A | * | 9/1995 | Wiedmann et al. .......... 365/154 |
| 5,744,844 | A | | 4/1998 | Higuchi |
| 5,930,163 | A | | 7/1999 | Hara et al. |
| 5,986,923 | A | | 11/1999 | Zhang et al. |
| 6,301,176 | B1 | * | 10/2001 | Brown ........................ 365/190 |
| 6,831,871 | B2 | * | 12/2004 | Khellah et al. .............. 365/203 |
| 2002/0188581 | A1 | | 12/2002 | Yamaoka et al. |
| 2003/0031044 | A1 | | 2/2003 | Higeta et al. |

FOREIGN PATENT DOCUMENTS

JP 2002-42476 A 2/2002

* cited by examiner

*Primary Examiner*—Huan Hoang
(74) *Attorney, Agent, or Firm*—McDermott Will & Emery LLP

(57) ABSTRACT

A dummy bit line is provided between a pair of bit lines. The pair of bit lines is set at a power supply voltage and the dummy bit line is set at a ground voltage, and then the pair of bit lines and the dummy bit line are equalized. When a word line is activated in subsequent read operation, the pair of bit lines is at an intermediate potential lower than the power supply voltage, so that an apparent current drive capability of an access transistor decreases, and the static noise margin of a memory cell increases.

8 Claims, 11 Drawing Sheets

SEMICONDUCTOR MEMORY DEVICE

BACKGROUND OF THE INVENTION

The present invention relates to a semiconductor memory device, and more particularly relates to a static random access memory (SRAM).

With recent downsizing in semiconductor processing, variation in transistor characteristics has been increasing. This has a large effect on circuit yields, and designs for suppressing the variation in transistor characteristics will become more and more important.

An SRAM memory cell of a six-transistor CMOS type has been known to date. This SRAM memory cell is constituted by three types of transistors (six transistors) in total, i.e., a pair of NMOS access transistors, a pair of NMOS drive transistors and a pair of PMOS load transistors.

To suppress variation in manufacturing SRAM memory cells and to reduce the memory cell area and the bit-line capacitance, a planar cell structure was devised. Unlike a vertical cell structure having an N-well in the upper half of a memory cell region and a P-well in the lower half thereof, in the planar cell structure, a pair of PMOS load transistors is placed on an N-well located at the center of a memory cell region, a first NMOS access transistor and a first NMOS drive transistor are placed on a left-hand P-well, and a second NMOS access transistor and a second NMOS drive transistor are placed on a right-hand P-well. In this case, the direction in which a bit line runs is defined as a longitudinal direction and the direction in which a word line runs is defined as a lateral direction (See U.S. Pat. Nos. 5,744,844 and 5,930,163).

In the vertical cell structure, an access transistor and a drive transistor are laid out to have their respective gates disposed vertically to each other. On the other hand, in the planar cell structure, an access transistor and a drive transistor are laid out to have their respective gates disposed in parallel with each other, so that the structure is less affected by variation in manufacture. In addition, the amount of wasted space is smaller than in the vertical cell structure, so that the memory cell area decreases and the bit line length becomes shorter accordingly, resulting in a small capacitance.

A static noise margin in read operation is one of the measures of stability of the memory cell. The static noise margin indicates whether data held in the memory cell is destroyed or not when a word line is activated. As the static noise margin increases, the memory cell in read operation becomes more stable (see Japanese Laid-Open Publication No. 2002-042476).

Conventionally, to increase the static noise margin in read operation, the current drive capability of a drive transistor is made higher than that of an access transistor in a memory cell. Specifically, the gate-width ratio of the access transistor to the drive transistor is set at about 1:1.5, for example. A six-transistor memory cell includes a high-potential memory node and a low-potential memory node so that when a word line is activated for read operation, current flows from one of a pair of bit lines precharged to a power supply voltage into the low-potential memory node. Accordingly, the voltage at the low-potential memory node rises to a potential determined by the ratio between the on-state resistance of the access transistor and the on-state resistance of the drive transistor. If this voltage rise is too large, a malfunction that the data held in the low-potential memory node changes to high occurs. In view of this, to suppress such a voltage rise at the low-potential memory node in read operation, the current drive capability of the drive transistor is conventionally set high to have the on-state resistance of the drive transistor low.

If the planar cell structure is adopted for an SRAM and the gate width of an access transistor is smaller than that of a drive transistor as described above, a doped layer of the access transistor is bent in a concave shape at the gate thereof. During a process for fabricating such an SRAM memory cell, if the gate of the access transistor shifts along the channel direction of the transistors, the effective gate width of the access transistor increases, so that electrical characteristics of the transistor change greatly. As a result, there arise a problem that the static noise margin decreases to cause a malfunction in read operation and thus the yield decreases largely.

SUMMARY OF THE INVENTION

It is therefore an object of the present invention to provide a semiconductor memory device operating with stability even in the case of an SRAM memory cell in which an access transistor and a drive transistor have the same gate width.

In order to achieve this object, each first and second semiconductor memory devices according to the present invention includes a six-transistor memory cell and also includes a word line and a pair of bit lines connected to the memory cell. In each of the first and second semiconductor memory devices, voltages on the pair of bit lines before read operation of the memory cell are set at a given voltage lower than a power supply voltage. By thus reducing the voltages on the pair of bit lines, the pair of bit lines is at an intermediate potential lower than the power supply voltage when the word line is activated for read operation. Accordingly, out of a high-potential memory node and a low-potential memory node formed in the memory cell, a voltage at the low-potential memory node is reduced lower than that of the prior art. As a result, even if an access transistor and a drive transistor have the same gate width, an apparent current drive capability of the access transistor decreases and a static noise margin increases, thus preventing a malfunction in read operation.

Specifically, the first inventive semiconductor memory device adopts a configuration including: means for precharging the pair of bit lines to a power source voltage; a dummy bit line different from the pair of bit lines; means for discharging the dummy bit line to a first voltage lower than the power supply voltage; and means for equalizing the pair of bit lines precharged to the power source voltage and the dummy bit line discharged to the first voltage. With this configuration, voltages on the pair of bit lines before read operation of the memory cell are set at a second voltage lower than the power supply voltage.

The second inventive semiconductor memory device adopts a configuration including means for precharging the pair of bit lines to a power supply voltage; and means for discharging the pair of bit lines precharged to the power supply voltage for a given period of time. With this configuration, voltages on the pair of bit lines before read operation of the memory cell are set at a given voltage lower than the power supply voltage.

To achieve the above object, a third semiconductor memory device according to the present invention includes a six-transistor memory cell; and a word line and a pair of bit lines connected to the memory cell, wherein an activation voltage on the word line in read operation of the memory cell is set at a given voltage lower than a power supply voltage. By thus reducing the voltage on the word line, the on-state resistance of an access transistor in read operation is higher than the on-state resistance of a drive transistor, so that the voltage at a low-potential memory node decreases. Accordingly, even if the access transistor and the drive transistor have the same gate width, the static noise margin is large enough to prevent a malfunction in read operation.

DESCRIPTION OF THE PREFERRED EMBODIMENTS

Hereinafter, CMOS-type SRAMs as semiconductor memory devices according to embodiments of the present invention will be described in detail with reference to the drawings.

Embodiment 1

Figure 1:
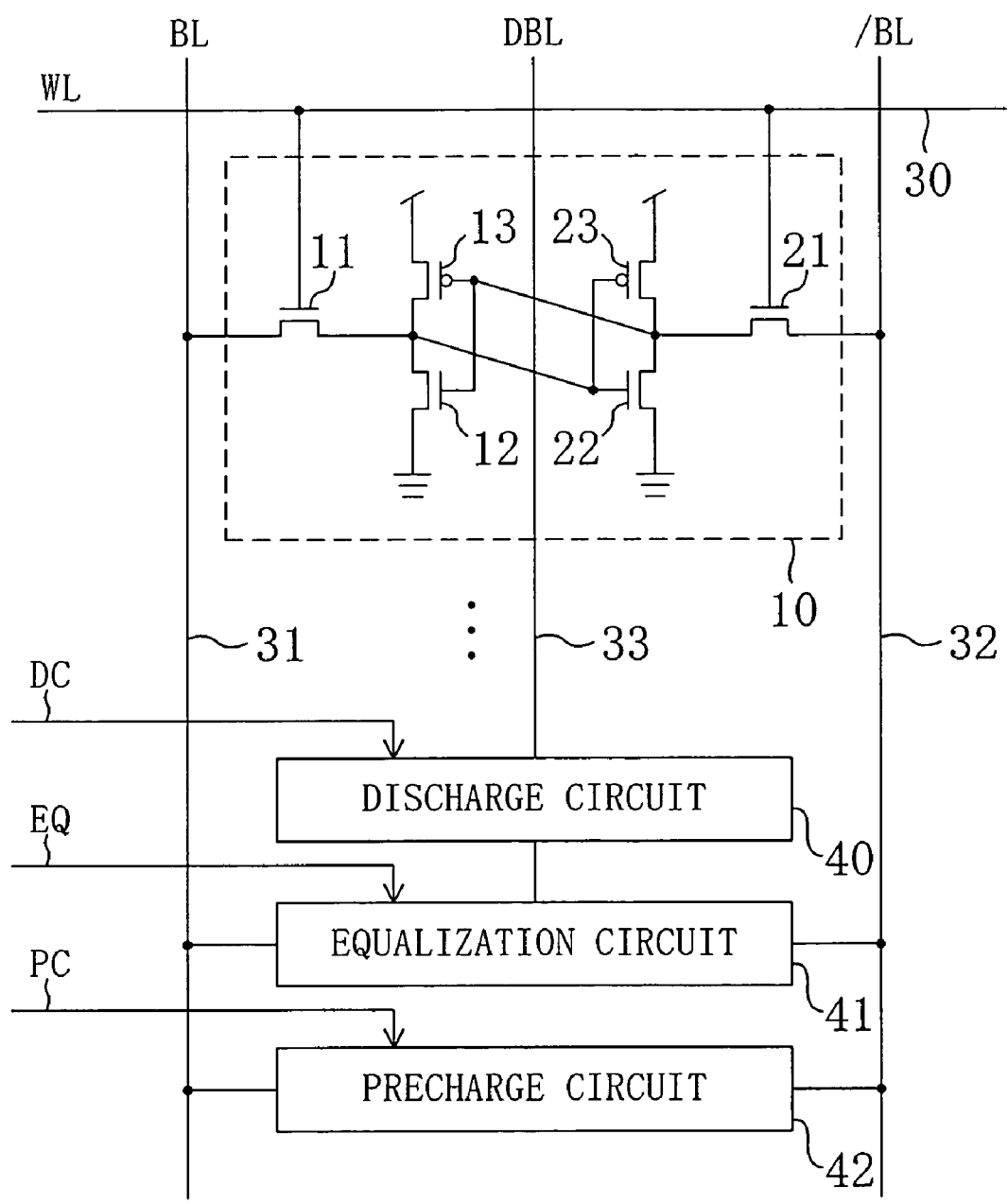
FIG. 1 is a circuit diagram showing a semiconductor memory device according to a first embodiment of the present invention.

FIG. 1 shows a configuration of a semiconductor memory device according to a first embodiment of the present invention. In FIG. 1, a memory cell 10 is a six-transistor memory cell including: a pair of NMOS access transistors 11 and 21; a pair of NMOS drive transistors 12 and 22; and a pair of PMOS load transistors 13 and 23. Reference numeral 30 denotes a word line (WL), reference numerals 31 and 32 denote a pair of bit lines (BL and /BL), reference numeral 33 denotes a dummy bit line (DBL), reference numeral 40 denotes a discharge circuit, reference numeral 41 denotes an equalization circuit and reference numeral 42 denotes a precharge circuit. The memory cell 10 is connected to the word line 30 and the pair of bit lines 31 and 32. The discharge circuit 40 is connected to the dummy bit line 33 and receives a discharge control signal DC. The equalization circuit 41 is connected to the pair of bit lines 31 and 32 and the dummy bit line 33 and receives an equalization control signal EQ. The precharge circuit 42 is connected to the pair of bit lines 31 and 32 and receives a precharge control signal PC.

The precharge circuit 42 precharges the pair of bit lines 31 and 32 to a power supply voltage when the precharge control signal PC is at an L level (ground voltage: 0V). The discharge circuit 40 discharges the dummy bit line 33 to the ground voltage when the discharge control signal DC is at an L level. The equalization circuit 41 equalizes the voltages on the pair of bit lines 31 and 32 and the voltage on the dummy bit line 33 when the equalization control signal EQ is at an H level (power supply voltage).

Figure 2:
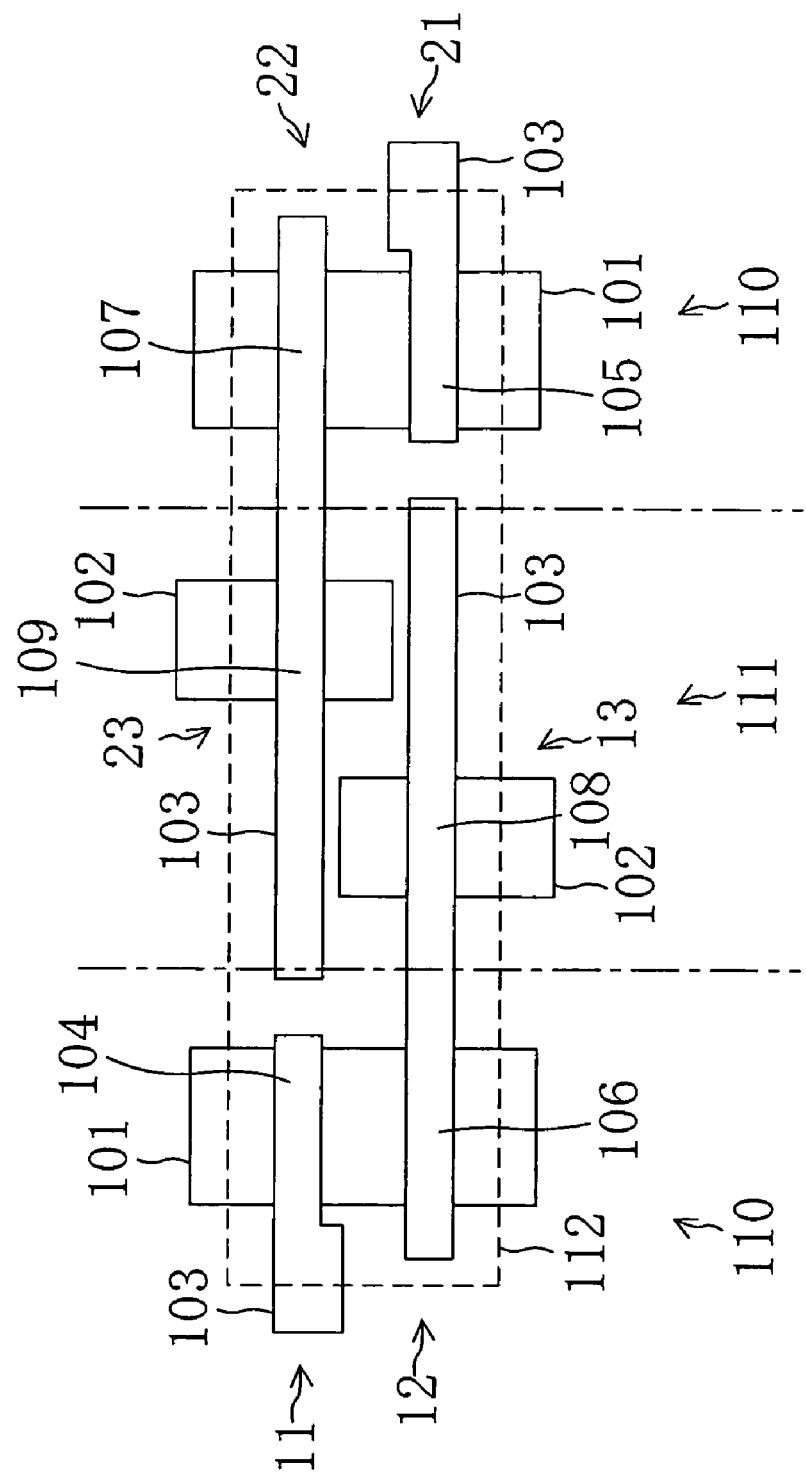
FIG. 2 is a layout view showing a base of a memory cell shown in FIG. 1.
Figure 3:
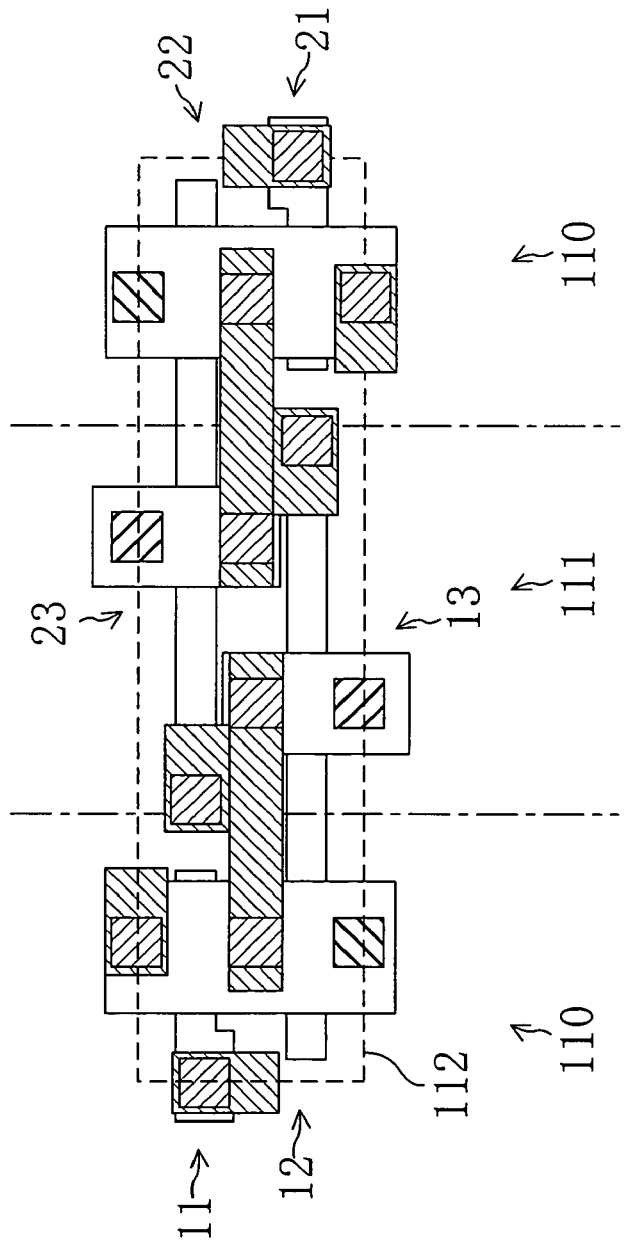
FIG. 3 is a layout view showing layers from the base to a first metal interconnect layer of the memory cell shown in FIG. 1.
Figure 4:
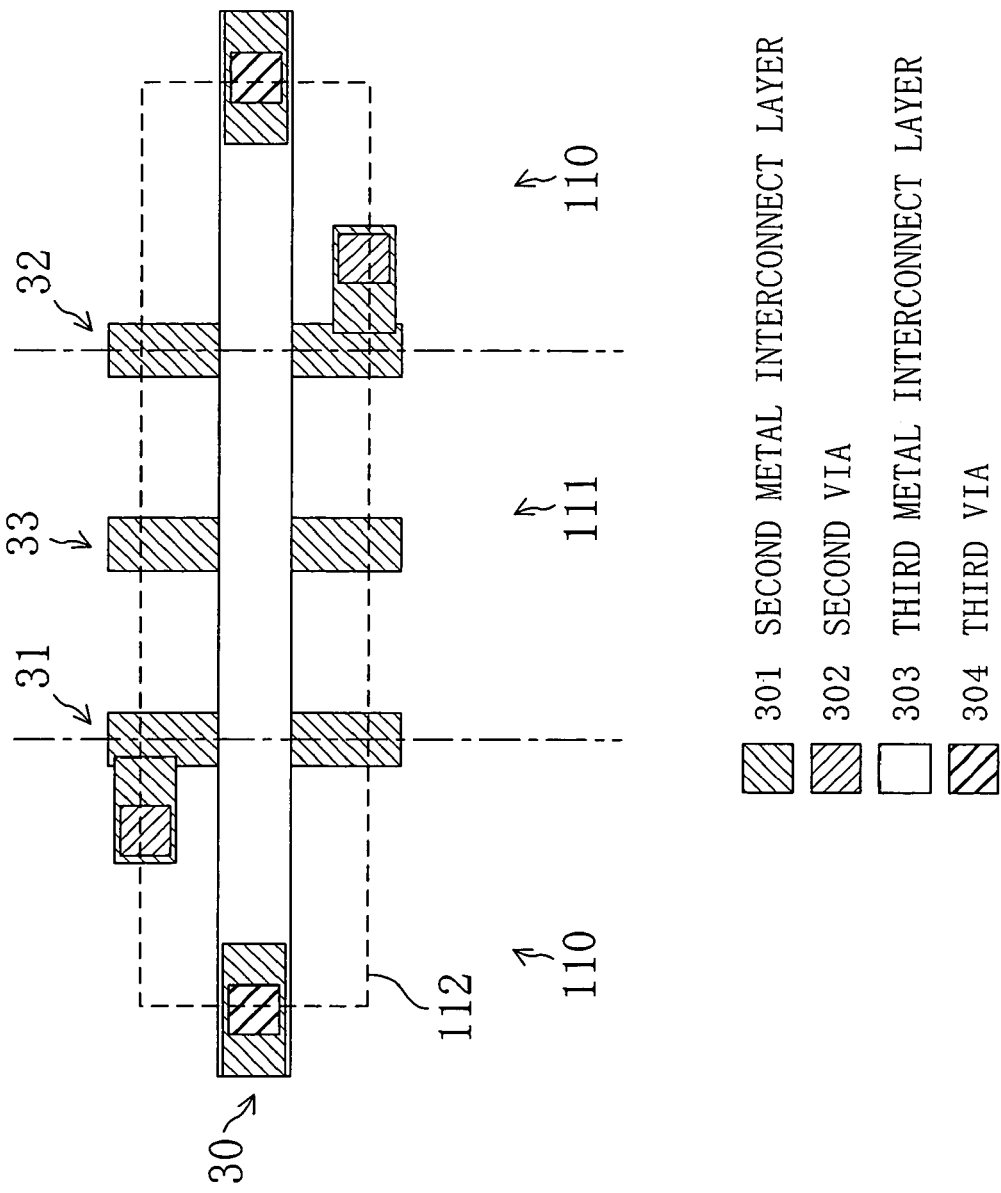
FIG. 4 is a layout view showing layers above the first metal interconnect layer of the memory cell shown in FIG. 1.

FIGS. 2 through 4 are views showing respective layouts of the memory cell 10 shown in FIG. 1. FIG. 2 shows a base, FIG. 3 shows layers from the base to a first metal interconnect layer, and FIG. 4 shows layers above the first metal interconnect layer. FIG. 2 shows doped layers 101 and 102 of the memory cell 10 and a polysilicon layer 103. FIG. 3 shows a first metal interconnect layer 201, first vias 202, grounds 203 and power sources 204 formed on the layout shown in FIG. 2. FIG. 4 shows a second metal interconnect layer 301, second vias 302, a third metal interconnect layer 303 and third vias 304. The first vias 202 connect the doped layers 101 and 102 and the polysilicon layer 103 to the first metal interconnect layer 201. The second vias 302 connect the first metal interconnect layer 201 to the second metal interconnect layer 301. The third vias 304 are interposed between the first metal interconnect layer 201 and the second metal interconnect layer 301 and also between the second metal interconnect layer 301 and the third metal interconnect layer 303 so as to connect the first metal interconnect layer 201 to the third metal interconnect layer 303.

More specifically, in FIG. 2, reference numerals 101 and 102 denote doped layers, reference numeral 103 denotes a polysilicon layer, reference numeral 110 denotes a P-well and reference numeral 111 denotes an N-well. Reference numerals 104 and 105 denote access transistors (corresponding to the NMOS access transistors 11 and 21 in FIG. 1), reference numerals 106 and 107 denote drive transistors (corresponding to the NMOS drive transistors 12 and 22 in FIG. 1) and reference numerals 108 and 109 denote load transistors (corresponding to the PMOS load transistors 13 and 23 in FIG. 1). The drive transistor 106 and the load transistor 108 are connected to each other via the first metal interconnect layer 201 to form an inverter. In the same manner, the drive transistor 107 and the load transistor 109 are connected to each other via the first metal interconnect layer 201 to form an inverter. The drain of the access transistor 104 and the drain of the drive transistor 106 are connected to each other at the doped layer. The drain of the access transistor 105 and the drain of the drive transistor 107 are connected to each other at the doped layer. The gates of the access transistors 104 and 105 are connected to the third metal interconnect layer 303 serving as the word line 30 via the first vias 202, the first metal interconnect layer 201, the second metal interconnect layer 301 and the third vias 304, as shown in FIGS. 3 and 4. The sources of the access transistors 104 and 105 are connected to the second metal interconnect layer 301 serving as the pair of bit lines 31 and 32 via the first vias 202, the first metal interconnect layer 201 and the second vias 302. The access transistor 104 and the drive transistor 106 are disposed such that their respective gates are parallel with each other and have the same gate width so as to make no unevenness in the doped layer. In the same manner, the access transistor 105 and the drive transistor 107 are disposed such that their gates are parallel with each other and have the same gate width so as to make no unevenness in the doped layer.

As shown in FIG. 4, the dummy bit line 33 made of the second metal interconnect layer 301 is placed between the pair of bit lines 31 and 32. Accordingly, the dummy bit line 33 serves as a shield to eliminate a crosstalk between the pair of bit lines 31 and 32. In addition, a wiring region occupied by the dummy bit line 33 is not a region where wiring is present originally. Accordingly, no area penalty occurs.

With the configurations shown in FIGS. 2 through 4, even if the gates of the access transistors 104 and 105 shift along the channel direction of the transistors, effective gate widths of the access transistors 104 and 105 do not increase, so that the static noise margin in read operation do not decrease and the variation in electrical characteristics of the transistors is minimized. Accordingly, it is possible to prevent decrease of the yield due to a malfunction in read operation.

Figure 5:
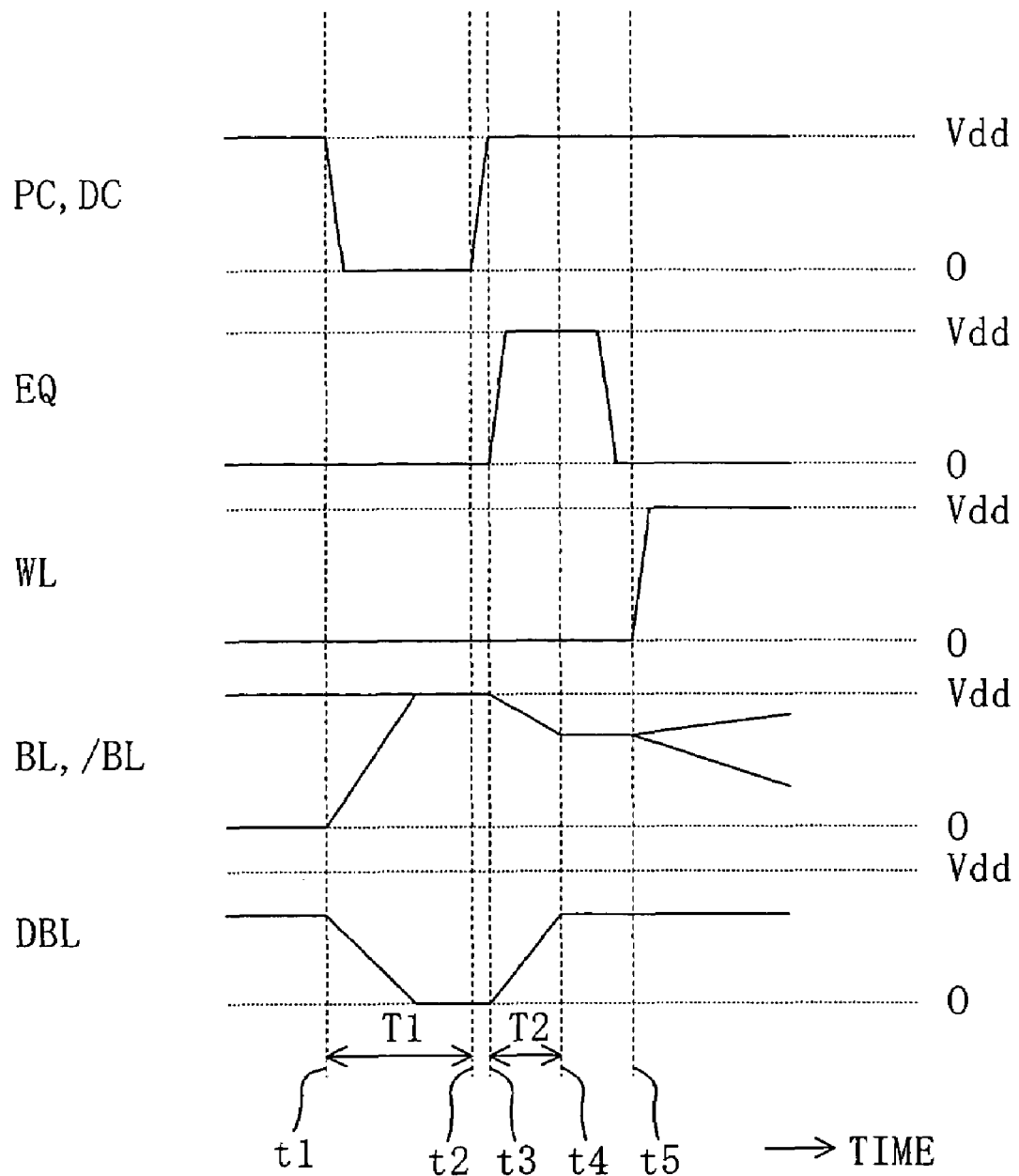
FIG. 5 is a timing chart showing read operation of the semiconductor memory device shown in FIG. 1.

FIG. 5 shows respective voltage waveforms of the precharge control signal PC, the discharge control signal DC, the equalization control signal EQ, the word line WL, the pair of bit lines BL and /BL and the dummy bit line DBL in read operation of the semiconductor memory device shown in FIG. 1. Reference sign Vdd denotes a power supply voltage.

According to FIG. 5, the precharge control signal PC and the discharge control signal DC are set at an L level at a time t1. That is to say, the pair of bit lines BL and /BL is precharged to the power supply voltage Vdd with the precharge control signal PC, and the dummy bit line DBL is discharged to the ground voltage (0V) with the discharge control signal DC (a period T1). After the precharge of the pair of bit lines BL and /BL and the discharge of the dummy bit line DBL have been completed, the pair of bit lines BL and /BL and the dummy bit line DBL are equalized with the equalization control signal EQ (a period T2). This operation distributes charge in the pair of bit lines BL and /BL to the dummy bit line DBL, resulting in that the voltages on the pair of bit lines BL and /BL drop to a voltage lower than the power supply voltage Vdd. In this case, the pair of bit lines BL and /BL and the dummy bit line DBL are not affected by variation in manufacturing transistors, so that a stable intermediate potential between the power supply voltage Vdd and the ground voltage (0V) is obtained. After this operation, the word line WL is selected and read operation of the memory cell 10 is initiated at a time t5.

According to the foregoing first embodiment, by reducing the precharge voltages on the pair of bit lines 31 and 32 with the dummy bit line 33 utilized, the pair of bit lines 31 and 32 is at an intermediate potential lower than the power supply voltage Vdd when the word line 30 is activated for read operation, so that the voltage at the low-potential memory node in the memory cell 10 is reduced. Accordingly, even if the NMOS access transistors 11 and 21 and the NMOS drive transistors 12 and 22 have the same gate width, apparent current drive capabilities of the NMOS access transistors 11 and 21 decrease and the static noise margin increases, thus preventing a malfunction in read operation.

In addition, it is possible to provide the dummy bit line 33 without increasing the layout area. Further, a plurality of power supplies are not needed, thus also suppressing the increase of the layout area. Moreover, since the dummy bit line 33 serves as a shield, the coupling capacitance between the pair of bit lines 31 and 32 is reduced even if the space between the pair of bit lines 31 and 32 is small, resulting in increasing the speed of reading operation of the memory cell 10.

Embodiment 2

Figure 6:
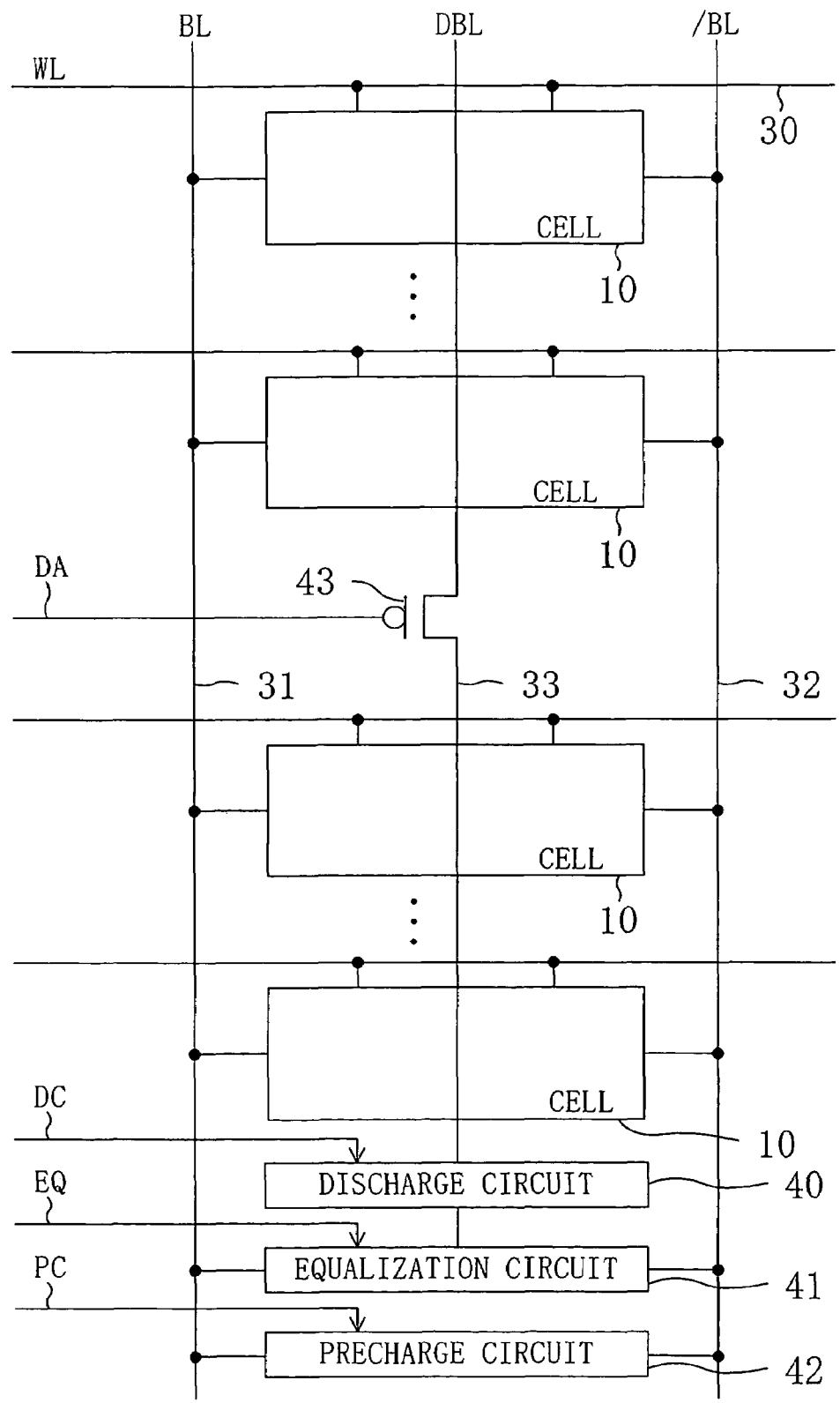
FIG. 6 is a circuit diagram showing a semiconductor memory device according to a second embodiment of the present invention.

FIG. 6 shows a configuration of a semiconductor memory device according to a second embodiment of the present invention. The configuration shown in FIG. 6 is different from that of the first embodiment in that a PMOS transistor, for example, is provided as a transistor 43 for electrically dividing a dummy bit line (DBL) 33 into two when a dummy-bit-line adjustment signal DA is at an H level. The other part of the configuration is the same as that of the first embodiment.

Figure 7:
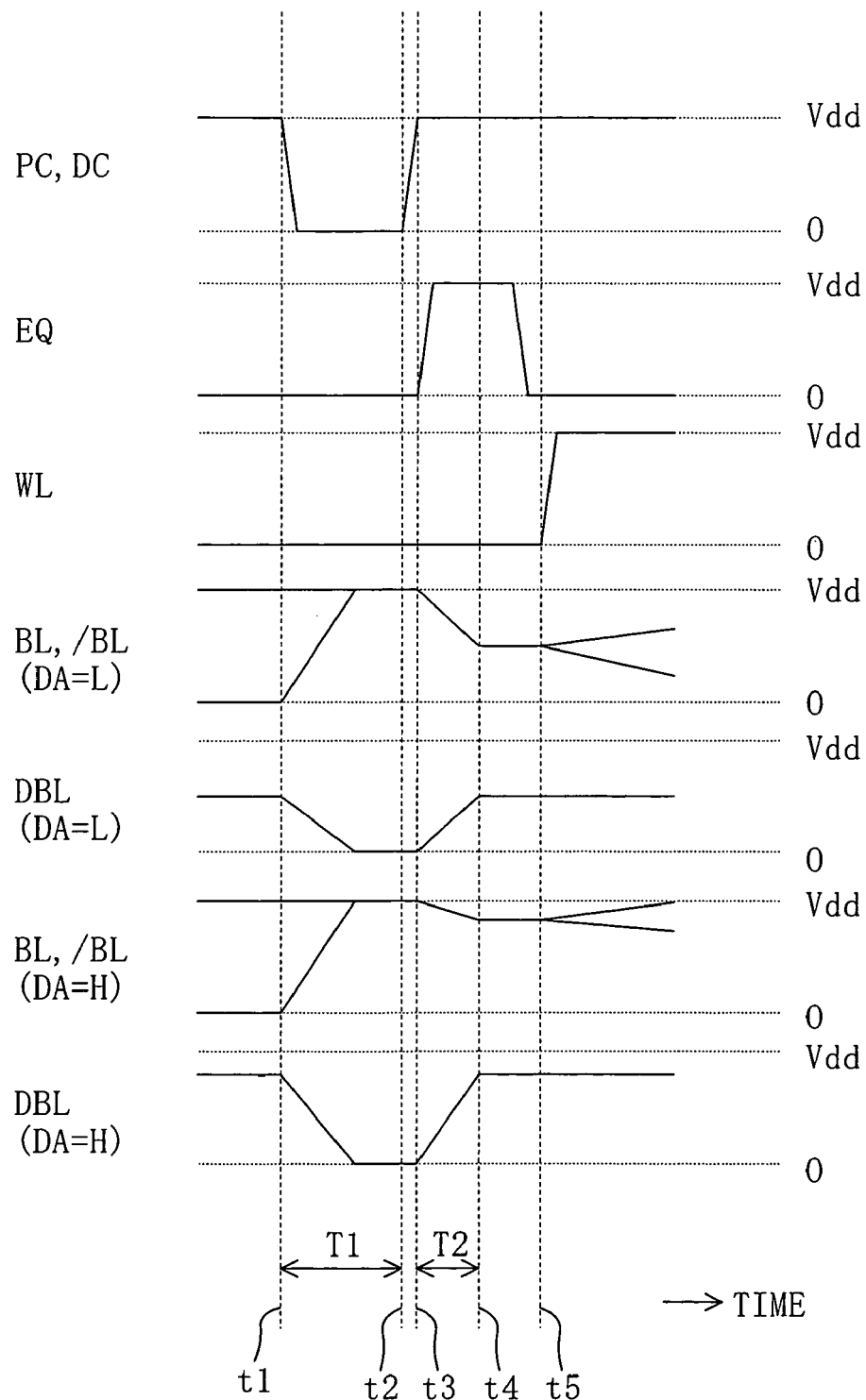
FIG. 7 is a timing chart showing read operation of the semiconductor memory device shown in FIG. 6.

FIG. 7 shows read operation of the semiconductor memory device shown in FIG. 6. According to FIG. 7, when the dummy-bit-line adjustment signal DA is at an L level and the PMOS transistor 43 is activated, the operation is the same as in the first embodiment. On the other hand, when the dummy-bit-line adjustment signal DA is at an H level and the PMOS transistor 43 is inactivated, a small amount of charge moves during equalization in a period T2, so that it is possible to reduce voltage drops on a pair of bit lines BL and /BL.

According to the foregoing second embodiment, the capacitance of the dummy bit line 33 is changed with the dummy-bit-line adjustment signal DA, thus making it possible to change the voltages on the pair of bit lines 31 and 32 after the equalization.

The dummy bit line 33 may be electrically divided into three or more by increasing the numbers of the dummy-bit-line adjustment signals DA and the PMOS transistors 43. If the dummy bit line capacitance is minutely set, the unit in adjusting the voltages on the pair of bit lines 31 and 32 after equalization is made small. In addition, if the number of divisions of the dummy bit line 33 is changed, the dummy bit line capacitance can also be changed. Increase of the dummy bit line capacitance allows the voltages on the pair of bit lines 31 and 32 after equalization to be set at lower values.

If even a single memory cell that has a static noise margin smaller than a desired value because of variation in manufacture and thus causes a malfunction in read operation is present within one column, adjustment of the dummy bit line capacitance to increase the static noise margin of the memory cell prevents the malfunction in read operation. This adjustment of the dummy bit line capacitance is preferably performed for every one column or every one group of columns in a memory cell array.

Embodiment 3

Figure 8:
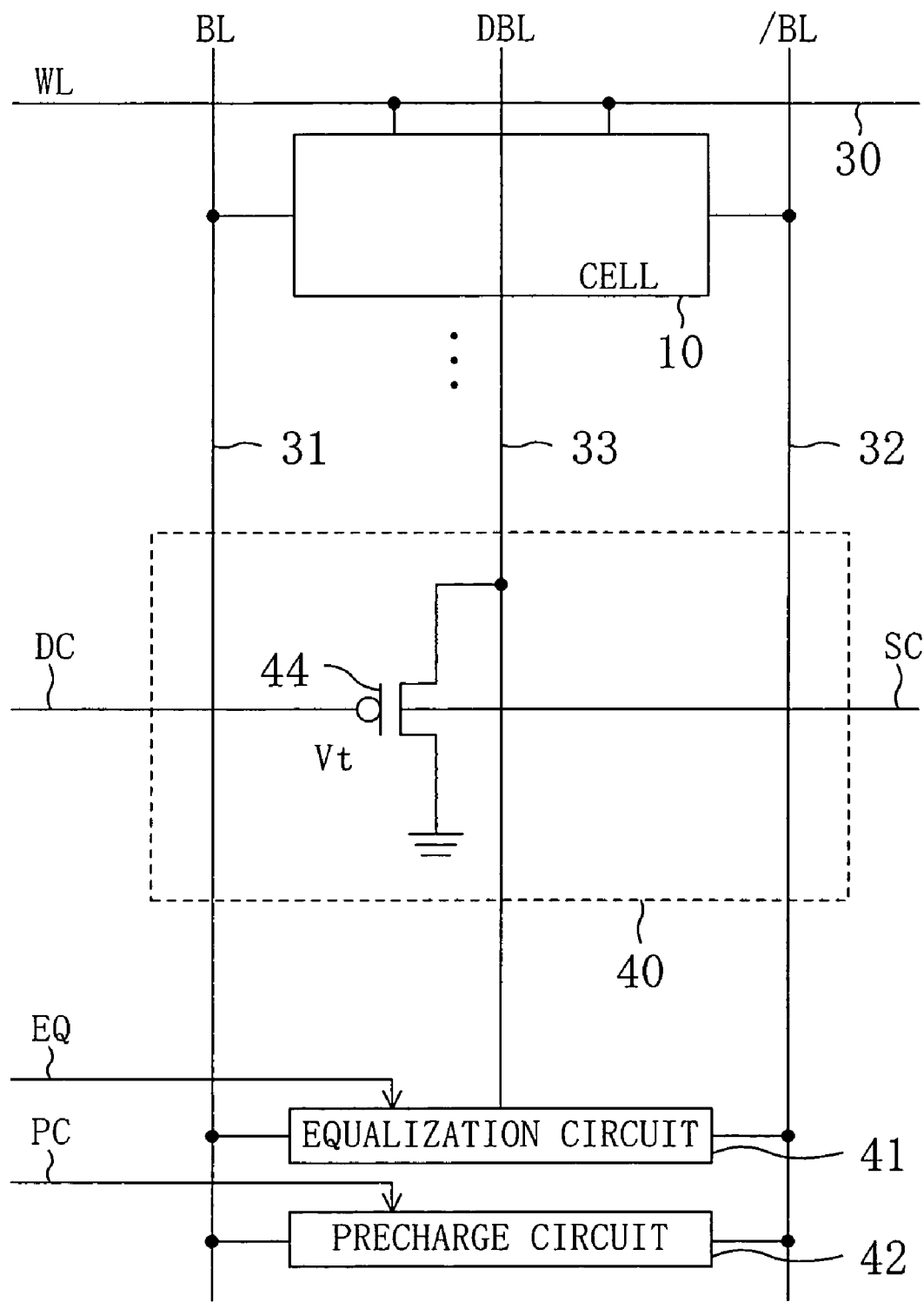
FIG. 8 is a circuit diagram showing a semiconductor memory device according to a third embodiment of the present invention.

FIG. 8 shows a configuration of a semiconductor memory device according to a third embodiment of the present invention. In the configuration shown in FIG. 8, the discharge circuit 40 of the first embodiment is constituted by a PMOS transistor 44 for drawing charge from a dummy bit line (DBL) 33. A discharge circuit 40 according to this embodiment discharges the dummy bit line 33 to a threshold voltage Vt of the PMOS transistor 44 when a discharge control signal DC is at an L level. Reference sign SC denotes a substrate potential control signal for changing a substrate potential of the PMOS transistor 44. The other part of the configuration is the same as in the first embodiment.

Figure 9:
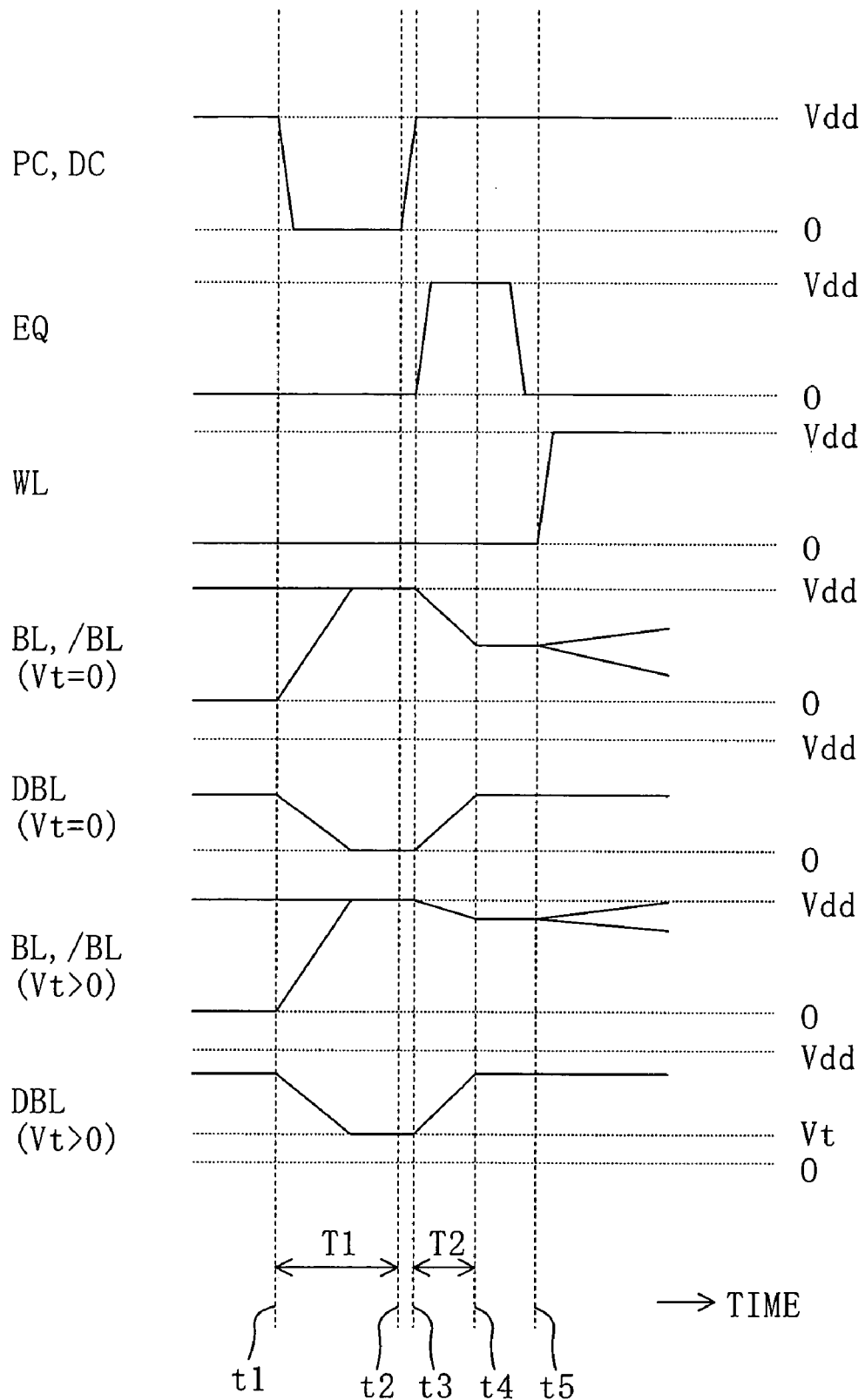
FIG. 9 is a timing chart showing read operation of the semiconductor memory device shown in FIG. 8.

FIG. 9 shows read operation of the semiconductor memory device shown in FIG. 8. According to the configuration shown in FIG. 8, the threshold voltage Vt of the PMOS transistor 44 is changed with the substrate potential control signal SC. For example, if the threshold voltage Vt is zero (Vt=0), the dummy bit line DBL is discharged to the ground voltage (0V) during a period T1. On the other hand, if the threshold voltage Vt is higher than zero (Vt>0), the dummy bit line DBL after discharge during the period T1 is at a given positive voltage. Accordingly, it is possible to continuously change the voltages on the pair of bit lines BL and /BL after equalization during a period T2 using the substrate potential control signal SC.

According to the foregoing third embodiment, the amount of charge on the dummy bit line 33 after discharge is changed with the substrate potential control signal SC, thus making it possible to change the voltages on the pair of bit lines 31 and 32 after equalization.

If even a single memory cell that has a static noise margin smaller than a desired value because of variation in manufacture and thus causes a malfunction in read operation is present within one column, adjustment of the voltage of the substrate potential control signal SC to increase the amount of discharge from the pair of bit lines 31 and 32 in this column prevents the malfunction in read operation. This adjustment of the substrate potential control signal SC is preferably performed for every one column or every one group of columns in a memory cell array.

Embodiment 4

Figure 10:
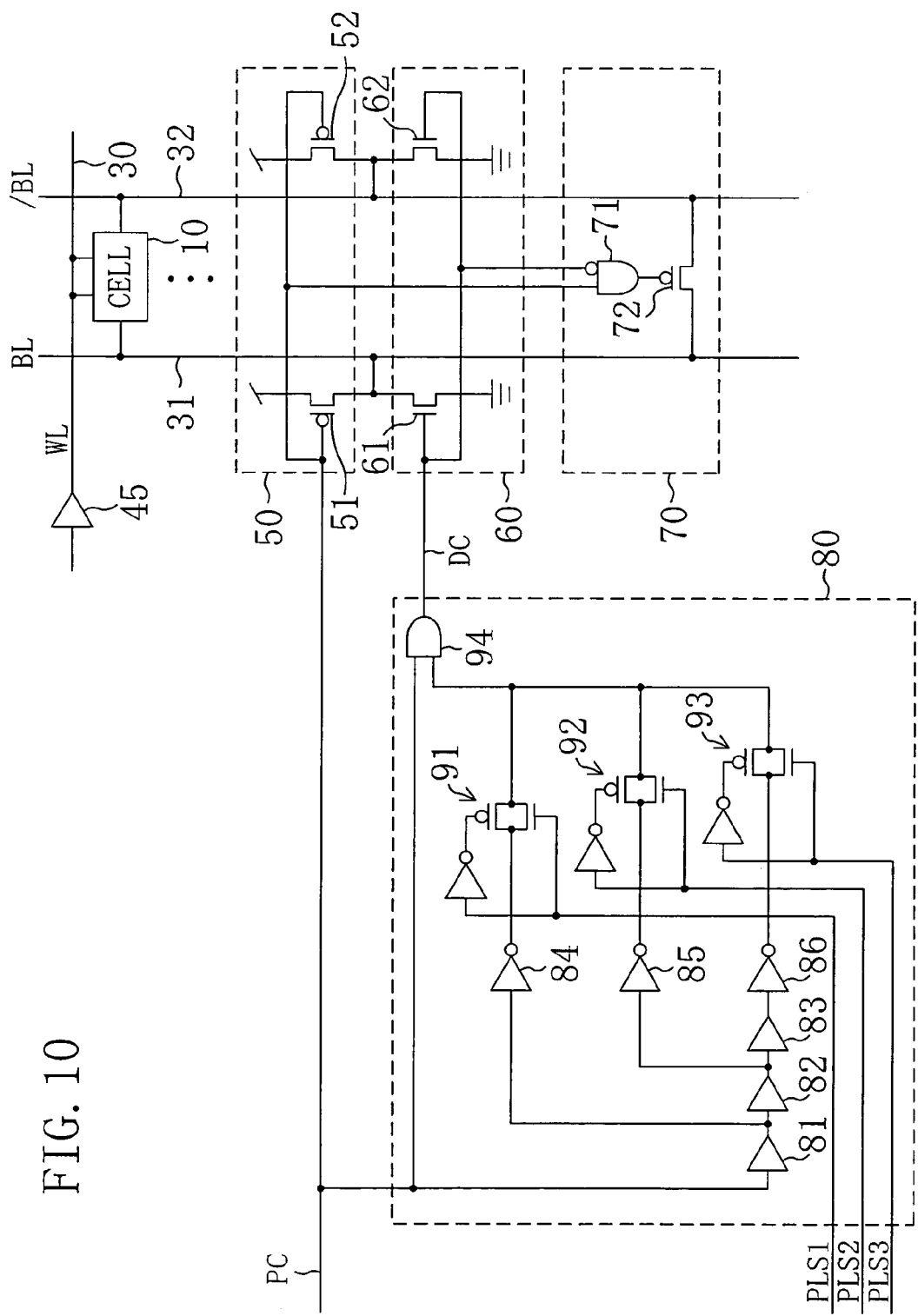
FIG. 10 is a circuit diagram showing a semiconductor memory device according to a fourth embodiment of the present invention.

FIG. 10 shows a configuration of a semiconductor memory device according to a fourth embodiment of the present invention. In FIG. 10, a memory cell 10 is a six-transistor memory cell having a planar cell structure shown in FIGS. 2 through 4. It should be noted that the dummy bit line 33 is unnecessary. Reference numeral 30 denotes a word line (WL), reference numerals 31 and 32 denotes a pair of bit lines (BL and /BL), reference numeral 45 denotes a word line driver, reference numeral 50 denotes a precharge circuit, reference numeral 60 denotes a bit-line discharge circuit, reference numeral 70 denotes an equalization circuit and reference numeral 80 denotes a bit-line-discharge-voltage control circuit. The memory cell 10 is connected to the word line 30 and the pair of bit lines 31 and 32.

The precharge circuit 50 is constituted by a pair of PMOS transistors 51 and 52 having drains connected to the pair of bit lines 31 and 32, respectively, sources connected to power sources and gates to which a precharge control signal PC is input. The bit-line discharge circuit 60 is constituted by a pair of NMOS transistors 61 and 62 connected to the pair of bit lines 31 and 32, respectively, sources connected to grounds and gates to which a discharge control signal DC is input. The equalization circuit 70 is constituted by a PMOS transistor 72 having a drain and a source connected to the pair of bit lines 31 and 32, respectively, and a gate to which an output from a logic circuit 71 is input. The logic circuit 71 supplies the logical product of the precharge control signal PC and the inversion of the discharge control signal DC to the gate of the PMOS transistor 72. Accordingly, equalization of the pair of bit lines 31 and 32 is executed in both a precharging time and a discharging time of the pair of bit lines 31 and 32. The bit-line-discharge-voltage control circuit 80 receives the precharge control signal PC and pulse control signals PLS1 through PLS3 so as to change the discharging time of the pair of bit lines 31 and 32, and outputs the discharge control signal DC. The bit-line-discharge-voltage control circuit 80 is constituted by: buffers 81, 82 and 83; inverters 84, 85 and 86; MOS switches 91, 92 and 93; and an AND circuit 94. The bit-line-discharge-voltage control circuit 80 selects one of the three different delay signals based on the precharge control signal PC, using the pulse control signals PLS1 through PLS3, and outputs the logical product of the selected result and the precharge control signal PC as the discharge control signal DC. Only one of the pulse control signals PLS1 through PLS3 is input at an H level, and the others are input at an L level.

Figure 11:
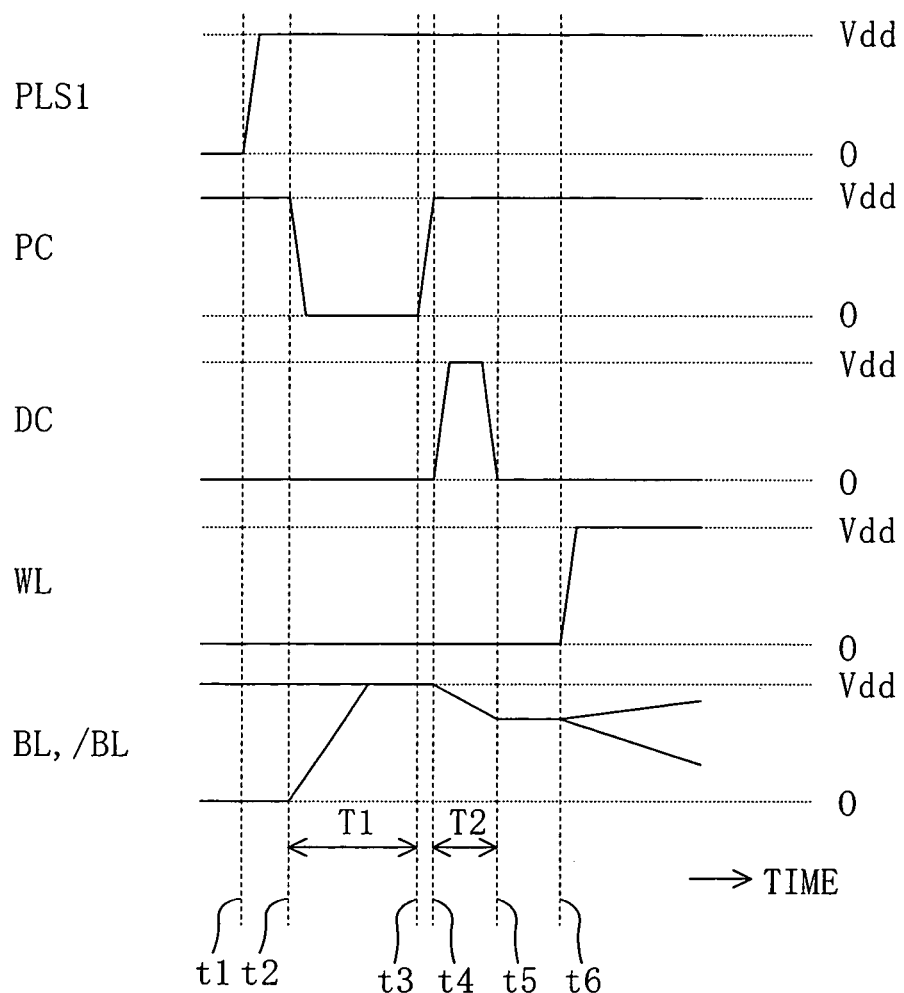
FIG. 11 is a timing chart showing read operation of the semiconductor memory device shown in FIG. 10.

FIG. 11 shows respective voltage waveforms of the pulse control signal PLS1, the precharge control signal PC, the discharge control signal DC, the word line WL and the pair of bit lines BL and /BL in read operation of the semiconductor memory device shown in FIG. 10. Reference sign Vdd denotes a power supply voltage.

According to FIG. 11, first, one of the pulse control signals PLS1 through PLS3 (e.g., PLS1) is set at an H level at a time t1, thereby determining the discharging time of the pair of bit lines BL and /BL. In this case, one of the three stages of the discharging time is selected. Then, the precharge control signal PC is set at an L level at a time t2, thereby precharging the pair of bit lines BL and /BL to the power supply voltage Vdd and equalizing the pair of bit lines BL and /BL. After the precharge performed during a period T1, the precharge control signal PC is returned to an H level and the precharge of the pair of bit lines BL and /BL is terminated. Then, discharge and equalization of the pair of bit lines BL and /BL are initiated at a time t4. A bit-line discharging period T2 has a length corresponding to a delay selected using the pulse control signals PLS1 through PLS3 in the bit-line-discharge-voltage control circuit 80. In this manner, the voltages on the pair of bit lines BL and /BL are reduced to a voltage lower than the power supply voltage Vdd. After this discharge has been completed, the word line WL is selected and read operation of the memory cell 10 is initiated at a time t6.

According to the foregoing fourth embodiment, by reducing the precharge voltages on the pair of bit lines 31 and 32 before read operation of the memory cell 10, the pair of bit lines 31 and 32 is at an intermediate potential lower than the power supply voltage Vdd when the word line 30 is activated for read operation, so that the voltage at a low-potential memory node in the memory cell 10 is reduced. Accordingly, even if the NMOS access transistors 11 and 21 and the NMOS drive transistors 12 and 22 shown in FIG. 1 have the same gate width, apparent current drive capabilities of the NMOS access transistors 11 and 21 decrease and the static noise margin increases, thus preventing a malfunction in read operation.

In addition, according to this embodiment, it is unnecessary to provide a plurality of power sources, thus suppressing increase of the layout area. Further, even in a case where the space between the dummy bit line 33 and each of the pair of bit lines 31 and 32 is too narrow to cancel the shield effect of the dummy bit line 33 in the first through third embodiments, harmful effects of decrease in readout speed due to increase in adjacent load capacitance between each of the pair of bit lines 31 and 32 and the dummy bit 33 is avoided in the fourth embodiment because the dummy bit line 33 is unnecessary.

If even a single memory cell that has a static noise margin smaller than a desired value because of variation in manufacture and thus causes a malfunction in read operation is present within one column, adjustment to increase the discharging time of the pair of bit lines 31 and 32 using the bit-line-discharge-voltage control circuit 80 also prevents the malfunction in read operation.

In a case where a plurality of pairs of bit lines are discharged, a single control circuit 80 can control the discharging time of all the pair of bit lines. Accordingly, this case has an advantage that the amounts of discharge from the pairs of bit lines are made equal with ease. The adjustment of the discharging time may be performed for every one column or every one group of columns in a memory cell array.

Embodiment 5

Figure 12:
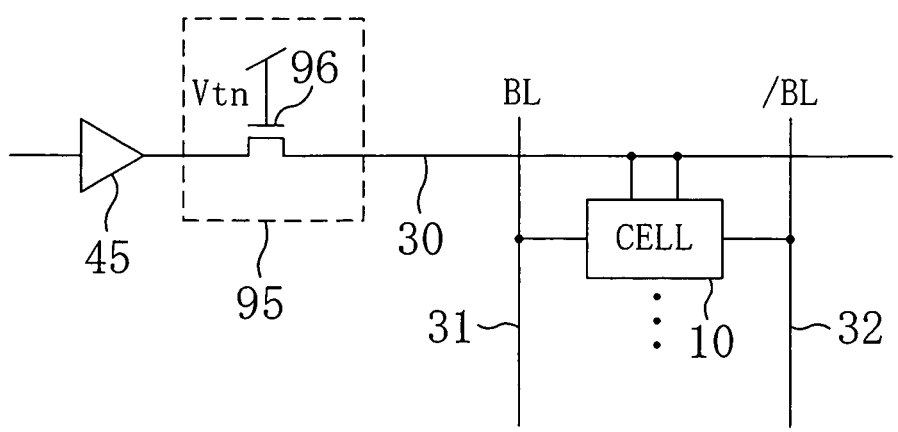
FIG. 12 is a circuit diagram showing a semiconductor memory device according to a fifth embodiment of the present invention.

FIG. 12 shows a configuration of a semiconductor memory device according to a fifth embodiment of the present invention. In FIG. 12, a memory cell 10 is a six-transistor memory cell having the planar cell structure shown in FIGS. 2 through 4. The dummy bit line 33 may be omitted. Reference numeral 30 denotes a word line (WL), reference numerals 31 and 32 denote a pair of bit lines (BL and /BL), reference numeral 45 denotes a word line driver and reference numeral 95 denotes a word-line-voltage set circuit. The memory cell 10 is connected to the word line 30 and the pair of bit lines 31 and 32. The word-line-voltage set circuit 95 is constituted by an NMOS transistor 96, for example. The NMOS transistor 96 has a gate connected to a power source, a source connected to an output of the word line driver 45 and a drain connected to the word line 30.

According to this embodiment, if reference sign Vdd denotes the power supply voltage and reference sign Vtn denotes the threshold voltage of the NMOS transistor 96, an activation voltage on the word line 30 when the word line 30 is selected, i.e., the gate voltages of the NMOS access transistors 11 and 21 shown in FIG. 1, is a given voltage (Vdd−Vtn) lower than the power supply voltage Vdd. Accordingly, the on-state resistances of the NMOS access transistors 11 and 21 in read operation are higher than those of the NMOS drive transistors 12 and 22, so that the voltage at a low-potential memory node is reduced. As a result, the static noise margin increases even if the NMOS access transistors 11 and 21 and the NMOS drive transistor 12 and 22 have same gate width, thus preventing a malfunction in read operation.

In addition, the activation voltage on the word line 30 may be changed by adjusting the substrate potential of the NMOS transistor 96, for example. If even a single memory cell that has a static noise margin smaller than a desired value because of variation in manufacture and thus causes a malfunction in read operation is present within one row, adjustment of the word line activating voltage in this row prevents the malfunction in read operation. This voltage adjustment may be performed for every one row or every one group of rows in a memory cell array.

What is claimed is:

1. A semiconductor memory device, comprising:
   a six-transistor memory cell; and
   a word line and a pair of bit lines, the word line and the pair of bit lines being connected to the memory cell, the semiconductor memory device further comprising:
   means for precharging the pair of bit lines to a power source voltage;
   a dummy bit line different from the pair of bit lines;
   means for discharging the dummy bit line to a first voltage lower than the power supply voltage; and
   means for equalizing the pair of bit lines precharged to the power source voltage and the dummy bit line discharged to the first voltage to set the voltages on the pair of bit lines before read operation of the memory cell at a second voltage lower than the power supply voltage.

2. The semiconductor memory device of claim 1, wherein the dummy bit line is placed between the pair of bit lines.

3. The semiconductor memory device of claim 1, including means for electrically dividing the dummy bit line into at least two.

4. The semiconductor memory device of claim 3, including means for changing the number of divisions of the dummy bit line.

5. The semiconductor memory device of claim 1, including means for controlling the first voltage on the dummy bit line to change the second voltage on the pair of bit lines.

6. The semiconductor memory device of claim 5, including means for changing a substrate potential of an MOS transistor for drawing charge from the dummy bit line when the dummy bit line is discharged.

7. A semiconductor memory device, comprising:
   a six-transistor memory cell; and
   a word line and a pair of bit lines, the word line and the pair of bit lines being connected to the memory cell, the semiconductor memory device further comprising:
   means for precharging the pair of bit lines to a power supply voltage;
   means for discharging the pair of bit lines precharged to the power supply voltage for a given period of time to set the voltage on the pair of bit lines before read operation of the memory cell at a given voltage lower than the power supply voltage; and
   means for changing a discharging time of the pair of bit lines.

8. A semiconductor memory device, comprising:
   a six-transistor memory cell; and
   a word line and a pair of bit lines, the word line and the pair of bit lines being connected to the memory cell, the semiconductor memory device further comprising:
   means for setting an activation voltage on the word line in read operation of the memory cell at a given voltage lower than a power supply voltage; and
   means for changing the activation voltage on the word line.

* * * * *

UNITED STATES PATENT AND TRADEMARK OFFICE
CERTIFICATE OF CORRECTION

PATENT NO. : 6,982,899 B2 Page 1 of 1
APPLICATION NO. : 10/752663
DATED : January 3, 2006
INVENTOR(S) : Norihiko Sumitani et al.

It is certified that error appears in the above-identified patent and that said Letters Patent is hereby corrected as shown below:

On the title page col. 2

Under section "(56) References Cited, U.S. PATENT DOCUMENTS", change " 2002/0188581" to -- 2002/0186581 --

Signed and Sealed this

First Day of August, 2006

JON W. DUDAS
*Director of the United States Patent and Trademark Office*